United States Patent [19]

Mitsuo

[11] Patent Number: 5,138,173
[45] Date of Patent: Aug. 11, 1992

[54] CHARGE DETECTOR FOR SEMICONDUCTOR SUBSTRATES

[75] Inventor: Yasaka Mitsuo, Tokyo, Japan

[73] Assignee: Tokyo Cathode Laboratory Co., Ltd., Tokyo, Japan

[21] Appl. No.: 628,815

[22] Filed: Dec. 17, 1990

[30] Foreign Application Priority Data

Dec. 20, 1989 [JP] Japan .................................. 1-331835
Jul. 30, 1990 [JP] Japan .................................. 2-202061

[51] Int. Cl.$^5$ .................................................. H01J 37/00
[52] U.S. Cl. .................................. 250/492.2; 250/397
[58] Field of Search ........... 250/492.2 R, 397, 492.21, 250/315.3; 369/72, 73, 126

[56] References Cited

U.S. PATENT DOCUMENTS 4,675,530 6/1987 Rose et al. ..................... 250/492.21

Primary Examiner—Jack I. Berman
Assistant Examiner—James E. Beyer
Attorney, Agent, or Firm—Townsend and Townsend

[57] ABSTRACT

A detecting electrode disposed at a position opposed to an article to be conveyed and an auxiliary electrode shielded from an external electric field are connected to a field effect transistor through switch means. When the article to be conveyed passes the front of the detecting electrode, charge is induced at the detecting electrode, the gate electric field of the field effect transistor is varied according to the quantity of charge to produce an output responsive to the quantity of charge. When the switch means is switched to the auxiliary electrode, a zero potential is detected. Therefore, the charged potential of the article to be conveyed can be accurately measured.

4 Claims, 5 Drawing Sheets

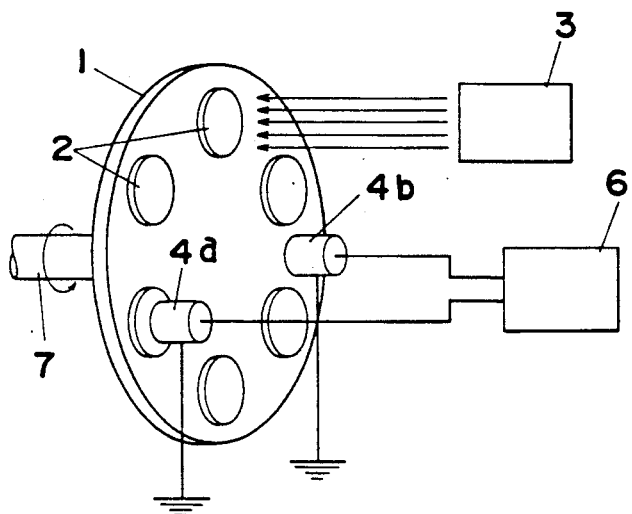
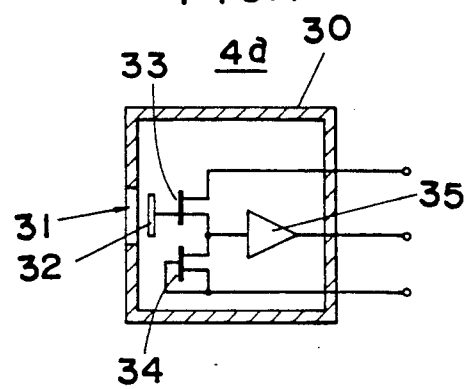
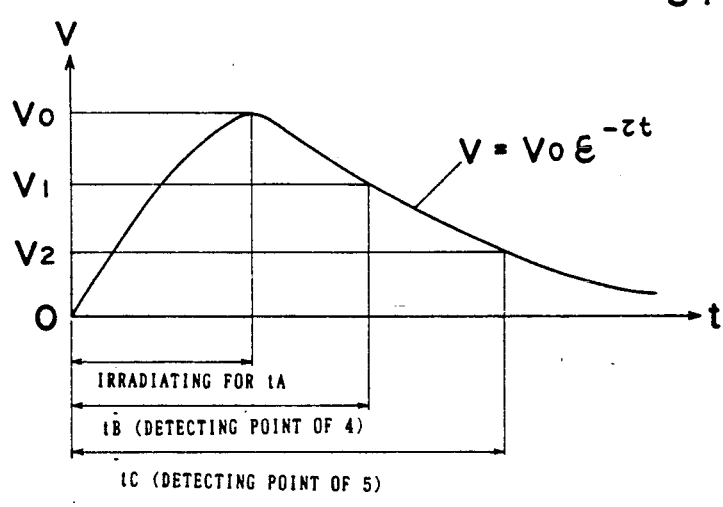

FIG.9
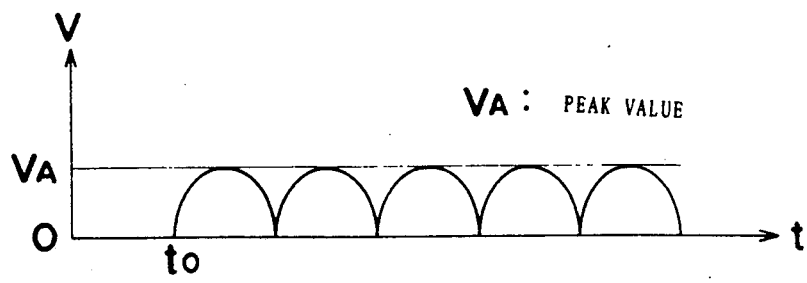
(a)
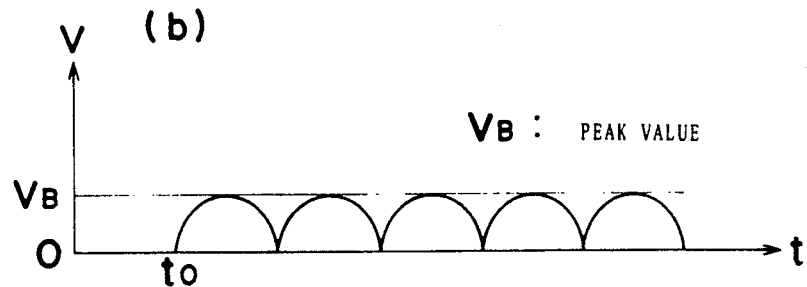
(b)
FIG.10
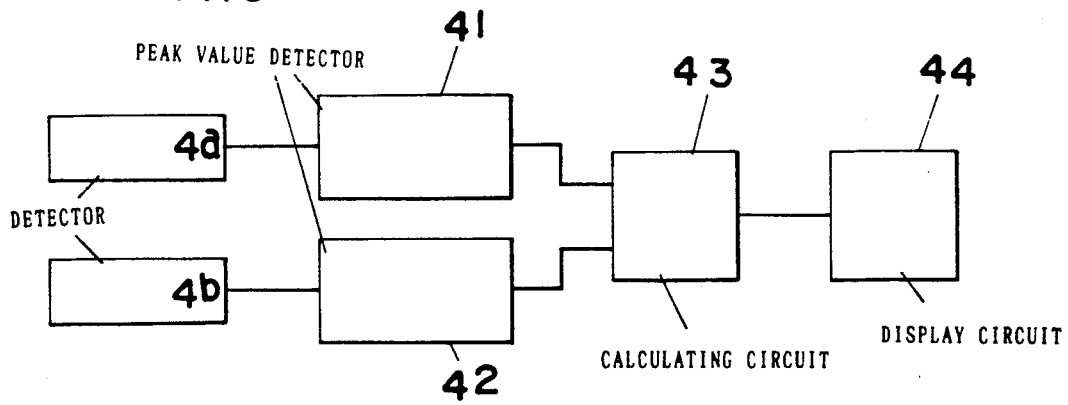

CHARGE DETECTOR FOR SEMICONDUCTOR SUBSTRATES

BACKGROUND OF THE INVENTION

1. Field of the Invention

This invention relates to an apparatus and a method for detecting charge and, more particularly, to means for accurately detecting the charged potential of an article to be conveyed such as a semiconductor substrate, etc.

2. Description of the Prior Art

FIG. 11 shows a conventional charge detecting apparatus for ion implantation. The charge detecting apparatus is composed of a detecting electrode 102, a field effect transistor 103, an amplifier 104, etc. contained in a case 101. An opening 105 is perforated at the front face of the detecting electrode 102. A semiconductor substrate 107 on a rotary disk 106 upon which ion implanting has been done is moved to the front of the opening 105 to induce charge at the detecting electrode, thereby varying the gate electric field of the field effect transistor 103. Thus, an output responsive to the variation in the quantity of the charge indicates the potential of the semiconductor substrate 107.

Since the surface potential of the rotary disk 106 on which the semiconductor substrate 107 is placed is zero in the above-described means, the potential of the semiconductor substrate 107 is equal to the detected value of the potential of the substrate 107 when the rotary disk 106 passes the front face of the detecting electrode 102.

However, a case that sometimes a case that the surface of the rotary disk 106 has deteriorated and the surface potential of the rotary disk 106 is not zero due to the film on the rotary disk 106. Thus, there arises a problem that the potential of the semiconductor substrate 107 cannot be accurately measured.

FIG. 12 shows a conventional apparatus for implanting ions onto a semiconductor substrate. Semiconductor substrates 201 are aligned on the surface of a rotary disk 200. An ion beam generator 202 is opposed to the rotary disk 200. When an ion beam irradiated from the ion beam generator 202 is radiated onto the semiconductor substrate 201, electrons are ejected from the semiconductor substrate 201. The semiconductor substrate 201 is thus charged causing the amount of ions implanted to be unpredictable or causing other problems, such as an insulator breakdown, etc. Therefore, in such an ion implanting step, the charging state of the semiconductor substrate is generally monitored.

Accordingly, a detecting electrode 203 is provided at a position opposed to the semiconductor substrate 201 on the rotary disk 200, a charge detector 204 for measuring the voltage of the detecting electrode 203 is provided, and the neutral amount of the charge on the surface of the semiconductor substrate 201 is determined according to the output signal of the charge detector 204.

It generally takes several milliseconds from when the ion beam is irradiated from the ion beam generator 202 to the semiconductor substrate 201 until the semiconductor substrate 201 passes the front of the detecting electrode 203 as described above. The charge attenuating characteristic during this period is different depending upon the type of semiconductor substrate 201 used. However, since the conventional above-described means uniformly determines the neutral amount of the charge of the semiconductor substrate in response to the voltage of the detecting electrode irrespective of the different charge attenuating characteristic depending upon the type of the substrate 201 used, there arises a problem that a suitable neutralization remedy cannot be employed in response to the type of the substrate.

SUMMARY OF THE INVENTION

Accordingly, a first object of this invention is to provide an apparatus for detecting charge which eliminates the above-described problems of the conventional means.

A second object of this invention is to provide an apparatus and a method for detecting charge which can employ a neutralization remedy responsive to the charge attenuating characteristic of the semiconductor substrate even if the type of a semiconductor substrate is different.

In order to achieve this and other objects, this invention provides an apparatus for detecting charge of an article to be conveyed by a conveying carrier comprising a detecting electrode disposed at a position opposed to said article to be conveyed, an auxiliary electrode shielded from an external electric field, a field effect transistor for producing an output responsive to a variation in quantity of charge by varying a gate electric field, and switch means for switching the connection of said detecting electrode and said auxiliary electrode to the gate of said field effect transistor.

When the article to be conveyed passes the front of the detecting electrode, charge is induced at the detecting electrode, varying the gate electric field of the field effect transistor according to the quantity of the charge induced at the detecting electrode, and an output responsive to the variation in the quantity of the induced charge is produced.

Since the switch means is switched to the auxiliary electrode to detect a zero potential, the charged potential of the article to be conveyed can be accurately measured.

These and other objects and features of the present invention will become apparent from the following detailed description in conjunction with the attached drawings.

BRIEF DESCRIPTION OF THE DRAWINGS

FIG. 6 is a perspective view of an ion implanting device;

FIG. 7 is a sectional view of a charge detector;

FIG. 8 is a charge attenuating characteristic diagram of a semiconductor substrate;

FIGS. 9(a) and 9(b) are output waveform diagrams of the charge detector;

FIG. 10 is a functional block diagram of a display device;

DESCRIPTION OF THE PREFERRED EMBODIMENTS

Embodiments of the present invention will now be described with reference to the accompanying drawings.

EMBODIMENT 1

A first embodiment of the present invention will be described with an instrument for measuring potential of a semiconductor substrate in an ion implanting step.

Figure 1:
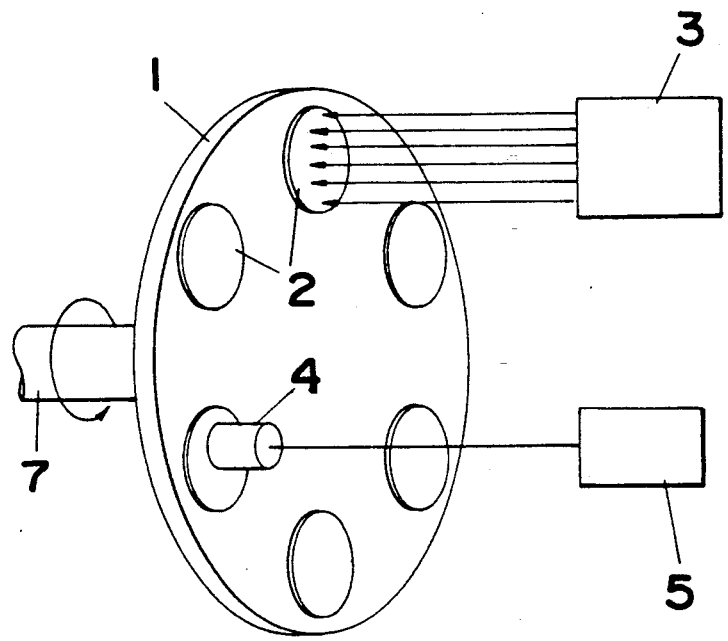
FIG. 1 is an overall view of an ion implanting device.

FIG. 1 shows an ion implanting devices for semiconductor substrates. A plurality of semiconductor substrates 2 are disposed as articles to be conveyed along a circumferential direction on the surface of a rotary disk 1 as conveying carrier rotating at a predetermined speed. An ion beam generator 3 irradiates an ion beam onto one of the semiconductor substrates 2. A charge detector 4 is disposed at a position opposed to one of the semiconductor substrates 2 and connected to a display device 5.

The rotary disk 1 is mounted perpendicularly to its rotational shaft 7. As the rotary disk 1 is rotated, the interval between the semiconductor substrate 2 and the charge detector 4 remains constant.

Figure 2:
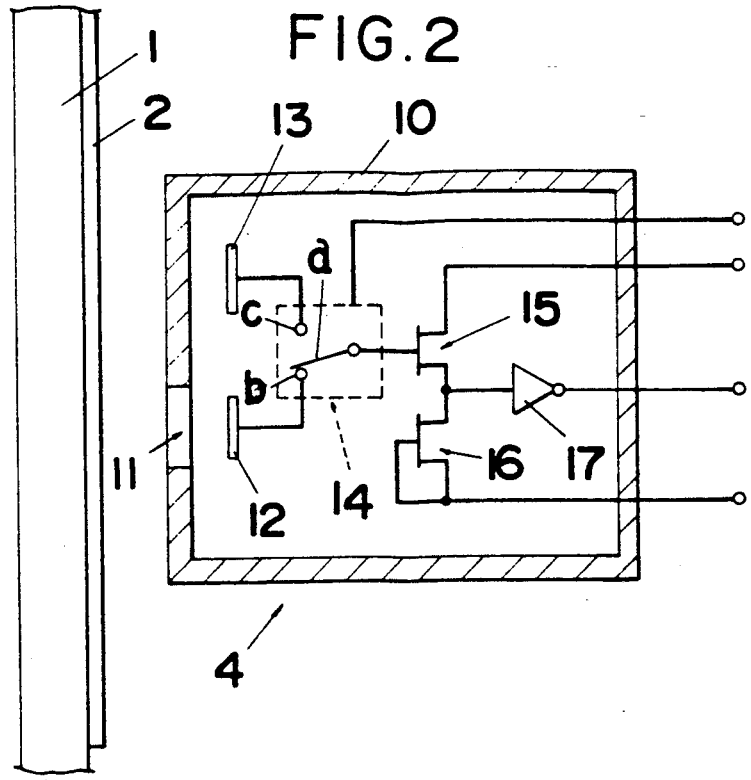
FIG. 2 is a sectional view of an embodiment of an apparatus for detecting charge according to the present invention.

The charge detector 4 will be described with reference to FIG. 2.

A case 10 contains an electric circuit and is formed of an electrostatically and electromagnetically shielding material. An opening 11 is perforated at the front face of the case 10. A detecting electrode 12, an auxiliary electrode 13, and switch means 14 for switching the electrodes 12 and 13 are disposed in the case 10. The detecting electrode 12 is disposed at a position opposed to the semiconductor substrate 2 on the rotary disk 1. The auxiliary electrode 13 is completely electrostatically shielded, and disposed at a position not affected by an external electric field. The electric circuit has a source follower circuit having field effect transistors 15 and 16. The gate of the field effect transistor 15 is connected to the detecting electrode 12 and the auxiliary electrode 13 through the switch means 14, and also connected at its output side to an amplifier 17.

The switch means 14 has a movable contact a connected to the field effect transistor 15, a stationary contact b connected to the detecting electrode 12 and another stationary contact c connected to the auxiliary electrode 13. Therefore, when the semiconductor substrate 2 passes the front of the detecting electrode 12 in a state where the movable contact a is connected to the stationary contact b, charge is induced at the detecting electrode 12, and the gate electric field of the field effect transistor 15 varies due to the charge induced at the detecting electrode 12 thereby obtaining an output responsive to the induced charge amount of the detecting electrode 12. When the variable contact a is shifted to be connected to the stationary contact c, zero potential is detected.

The operation of the first embodiment will be described. When an ion beam is irradiated from the ion beam generator 3 to the semiconductor substrate 2 while the rotary disk 3 is being rotated, the semiconductor substrate 2 is charged. When the semiconductor substrate 2 passes the front of the detecting electrode 12 in a state where the movable contact a is connected to the stationary contact b, a reverse polarity charge corresponding to the surface potential of the semiconductor substrate 2 appears at the detecting electrode 12 by means of electrostatic induction. A voltage responsive to the variation in the quantity of the charge stored at the detecting electrode 12 is applied to the gate of the field effect transistor 15. As a result, an output responsive to the variation in the quantity of the charge of the detecting electrode 12 is produced from the output terminal of the amplifier 17.

Figure 3:
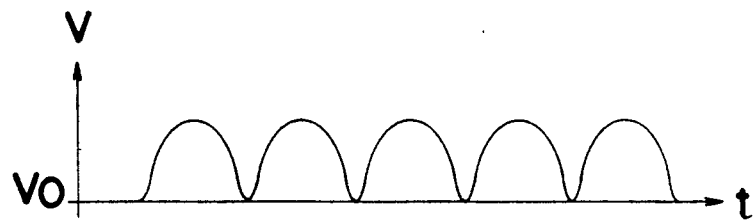
FIGS. 3 and 4 are output waveform diagrams of the apparatus of the invention.
Figure 4:
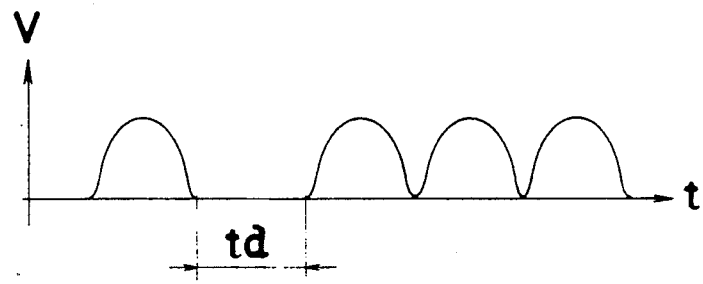

An output waveform of the amplifier 17 becomes a periodic crest-shaped waveform as shown in FIG. 3. The trough-shaped portion of the waveform indicates the output of the rotary disk 1. The switch means 14 is switched from the detecting electrode 12 to the auxiliary electrode 13 in synchronization with the rotation of the rotary disk 1 in a period of time shorter than the time constant determined by an insulating resistance between the detecting electrode 12 and a ground. Thus, the gate of the field effect transistor 15 discharges, and zero potential can be detected for a period ta of time as shown in FIG. 4. Therefore, the potential of the semiconductor substrate 2 can be accurately monitored with the zero potential obtained as described above as a reference, and a neutralization remedy can be more effectively employed.

EMBODIMENT 2

Figure 5:
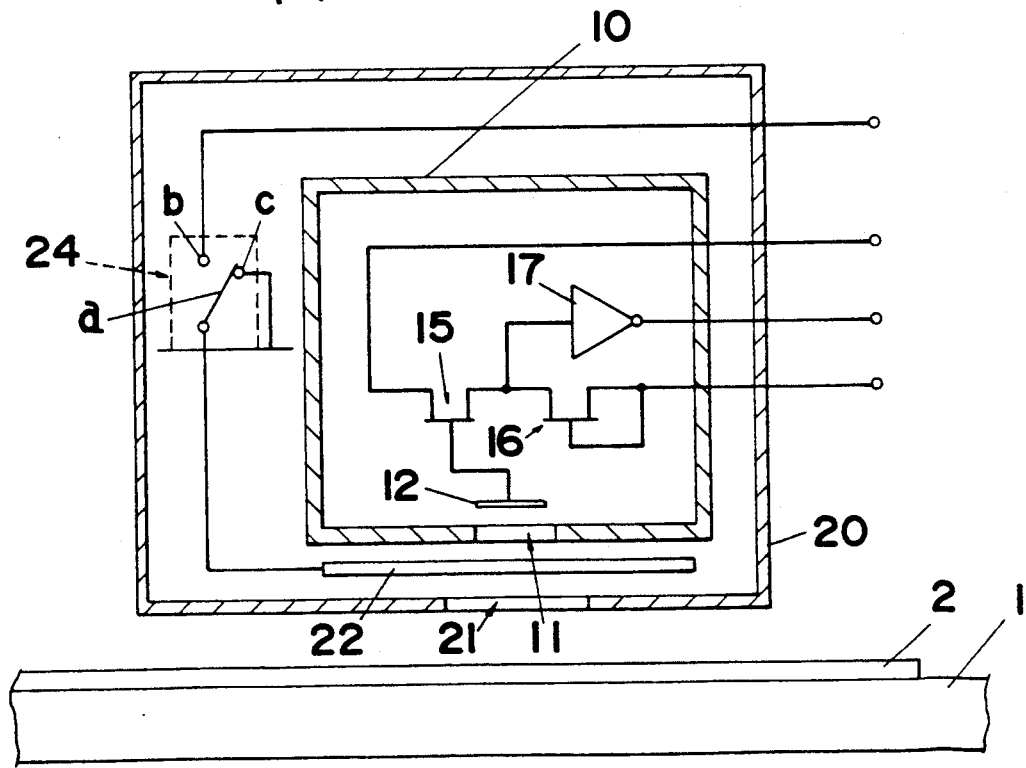
FIG. 5 is a sectional view of another embodiment of an apparatus for detecting charge according to the present invention.
Figure 11:
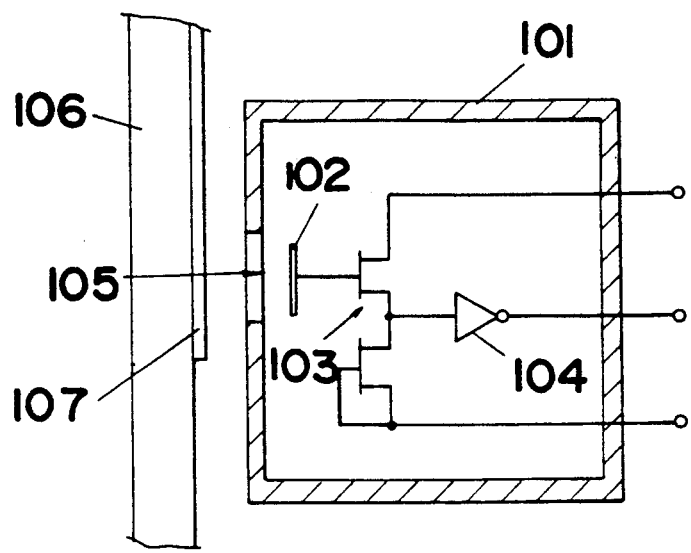
FIG. 11 is a sectional view of a prior art charge detector.
Figure 12:
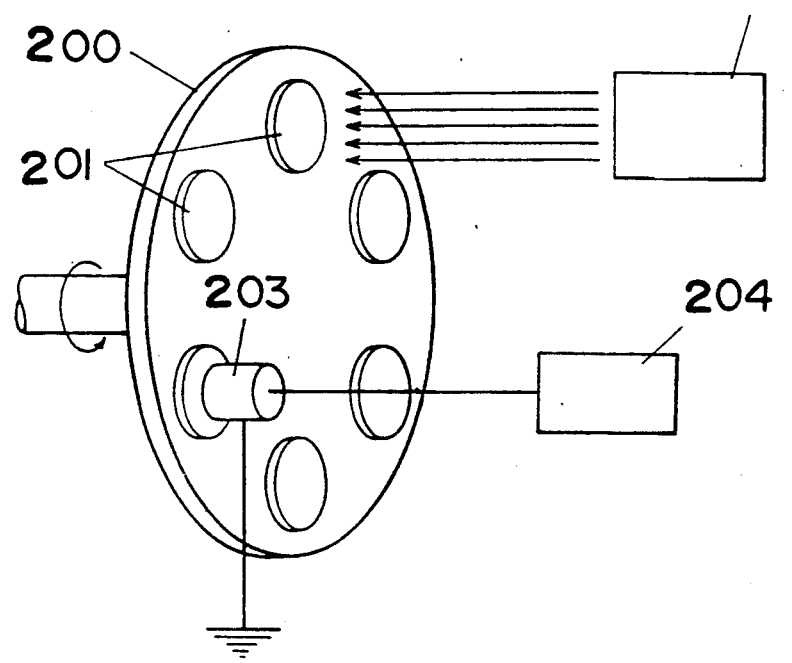
FIG. 12 is a perspective view of a prior art ion implanting device and charge detector.

FIG. 5 shows a second embodiment of an apparatus for detecting charge of the present invention. A case 10 is contained in an outer case 20. An opening 21 is also perforated at the front face of the outer case 20, and a shielding electrode 22 is disposed between an opening 11 and the opening 21. Switch means 24 has a movable contact a connected to the shielding electrode 22, a floating contact b and a ground contact c.

When the movable contact a is shifted to be connected to the floating contact b, the potential of a semiconductor substrate 2 is measured. When the movable contact a is shifted to be connected to the ground contact c, a zero potential is measured.

This embodiment is not limited to charge potential measuring means for the semiconductor substrate in the ion implanting step, but can be also used as charge potential measuring means for an article to be conveyed.

EMBODIMENT 3

FIG. 6 shows an ion implanting apparatus having a charge detector for a semiconductor substrate. A plurality of semiconductor substrates 2 are aligned along a circumferential direction on the surface of a rotary disk 1 rotating at a predetermined speed. An ion beam irradiated from an ion beam generator 3 is implanted to one of the semiconductor substrates 2. A plurality of charge detectors 4a, 4b are disposed at an interval at positions opposed to the semiconductor substrates 2, and connected to a display device 6. The charge detectors 4a and 4b have the same structure.

FIG. 8 shows the relationship between the surface potential V of the semiconductor substrate 2 after the ion beam is irradiated onto the substrate 2 and at times t later. The ion beam is radiated for a period of time $t_A$ sec., the charge detector 4a measures the surface charge of the semiconductor substrate 2 after a period of time $t_B$ sec., and the charge detector 4b measures the surface potential of the semiconductor substrate 2 after a period of time $t_C$ sec.

Now, details of the charge detector 4a will be described with reference to FIG. 7.

A case 30 contains an electric circuit, and is formed of an electrostatically and electromagnetically shielding material. An opening 31 is perforated at the front face of the case 30, and a detecting electrode 32 is disposed in the opening 31. The electric circuit has a source follower circuit including field effect transistors 33 and 34 and is connected at its output side to an amplifier 35. The detecting electrode 32 is disposed at a position opposed to the semiconductor substrate 2 on the rotary disk 1. When the semiconductor substrate 2 passes the front face of the detecting electrode 32, charge is induced at the detecting electrode 32, and the gate electric field of the field effect transistor 33 is varied according to the quantity of the charge induced at the detecting electrode 32 to obtain an output responsive to the quantity of the charge induced at the detecting electrode 32.

The third embodiment of the apparatus is constructed as described above, and the operation of the embodiment will be described.

When an ion beam is irradiated from the ion beam generator 3 to the semiconductor substrate 2 while the rotary disk 1 is being rotated, the semiconductor substrate 2 is charged. When the semiconductor substrate 2 passes the front of the charge detectors 4a and 4b, reverse polarity charges responsive to the surface potential of the semiconductor substrate 2 are stored at the detecting electrodes 32 by means of electrostatic induction. Then, the voltage responsive to the quantity of the charge induced at the detecting electrodes 32 is applied to the gate of the transistor 33, the output responsive to the quantity of the charge of the detecting electrode 32 is produced from the output terminal of the amplifier 35, thereby measuring the surface potential of the semiconductor substrate 2. As the rotary disk 1 is rotated, a plurality of the semiconductor substrates 2 sequentially pass the front of the charge detectors 4a and 4b, and the outputs of the charge detectors 4a and 4b become continued crest-shaped waveforms as shown in FIGS. 9(a) and 9(b).

The display device 6 now be described.

FIG. 10 is a functional block diagram of the display device.

The display device 6 has a peak value detector 41 for detecting the peak value VA of a signal from the charge detector 4a, and a peak value detector 42 for detecting the peak value VB of a signal from the charge detector 4b. The outputs of the peak value detectors 41 and 42 are input to a calculating circuit 43. The charge attenuating characteristic of the semiconductor substrate 2 is represented by the following equation (1). The following equations (2) and (3) are derived from equation (1).

$$V = V_0 \epsilon^{-\tau t} \quad (1)$$

$$\tau = \frac{1}{t_C - t_B} \ln \frac{V_1}{V_2} \quad (2)$$

$$V_0 = \frac{V}{\epsilon^{-\tau t}} \quad (3)$$

With the above equations, the surface potential of the semiconductor substrate 2 immediately after the ion beam is irradiated to the semiconductor substrate 2 can be calculated. In other words, the detecting voltages $V_1$ and $V_2$ of the charge detectors 4a and 4b are substituted in the equation (2) to calculate its attenuation constant $\tau$. The attenuation constant $\tau$ obtained in this manner is substituted in the equation (3) to obtain its peak value $V_0$. Thus, the calculating circuit 43 calculates based on the equations (2) and (3), and its output is connected to a display circuit 44 to display the calculated peak value $V_0$. Thus, the surface potential $V_0$ of the semiconductor substrate 2 immediately after the semiconductor substrate 2 is ion implanted can be monitored, and its neutralization remedy can be effectively performed. The present invention is not limited only to the ion implanting step. For example, the present invention can also be applied to charge detecting means in a dry process such as a dry etching, etc., using a plasma.

According to the present invention as described above, the surface charged potential of an article to be conveyed can be accurately measured.

What is claimed is:

1. An apparatus for detecting charge of an article to be conveyed by a conveying carrier comprising:
   a detecting electrode disposed at a position opposed to said article to be conveyed,
   an auxiliary electrode shielded from an external electric field,
   a field effect transistor for producing an output responsive to variation in quantity of charge by varying a gate electric field, and
   switch means for switching the connection of said detecting electrode and said auxiliary electrode to the gate of said field effect transistor.

2. An apparatus for detecting charge of an article to be conveyed by a conveying carrier comprising:
   a detecting electrode disposed at a position opposed to said article to be conveyed,
   a field effect transistor having a gate connected to said detecting electrode for producing an output responsive to variation in quantity of charge by varying a gate electric field,
   a shielding electrode disposed between said article to be conveyed and said detecting electrode, and
   switch means for switching the ground and non-ground of said shielding electrode.

3. An apparatus for detecting charge of a semiconductor substrate used for an ion implanting equipment for implanting ions to the semiconductor substrate disposed on a rotary disk from an ion beam generator comprising:
   a plurality of detectors each having a detecting electrode disposed at a position opposed to said semiconductor substrate and a field effect transistor connected at its gate to the detecting electrode and disposed at an interval therebetween, and
   a calculating circuit for producing an output responsive to quantity of charge by varying a gate electric field by means of charge induced at said detecting electrode, calculating charge attenuating characteristic of said semiconductor substrate by using the outputs of said charge detectors and calculating quantity of charge immediately after the ion beam is irradiated to said semiconductor substrate.

4. A method of detecting charge of a semiconductor substrate applied to an ion implanting equipment for implanting ions to the semiconductor substrate disposed on a rotary disk by irradiating the ions from an ion beam generator comprising the steps of:
   measuring voltages of a plurality of detecting electrodes disposed at an interval at positions opposed to said semiconductor substrate,
   calculating charge attenuating characteristic of said semiconductor substrate based on the measured voltages, and
   calculating quantity of charge immediately after the ion beam is irradiated to said semiconductor substrate by means of calculated attenuating characteristic.

* * * * *